(12) United States Patent
Choi et al.

(10) Patent No.: US 7,728,437 B2
(45) Date of Patent: Jun. 1, 2010

(54) SEMICONDUCTOR PACKAGE FORM WITHIN AN ENCAPSULATION

(75) Inventors: Soung-yong Choi, Seoul (KR); Min-hyo Park, Yongin-si (KR)

(73) Assignee: Fairchild Korea Semiconductor, Ltd., Bucheon-si (KR)

( * ) Notice: Subject to any disclaimer, the term of this patent is extended or adjusted under 35 U.S.C. 154(b) by 548 days.

(21) Appl. No.: 11/286,786

(22) Filed: Nov. 23, 2005

(65) Prior Publication Data

US 2007/0114661 A1    May 24, 2007

(51) Int. Cl.
*H01L 23/52* (2006.01)
*H01L 23/532* (2006.01)

(52) U.S. Cl. .................. 257/774; 257/734; 257/737; 257/E23.174

(58) Field of Classification Search .......... 257/774, 257/E23.174, 734, 737
See application file for complete search history.

(56) References Cited

U.S. PATENT DOCUMENTS

| | | | |
|---|---|---|---|
| 4,940,181 A | 7/1990 | Juskey, Jr. et al. |
| 5,092,033 A | 3/1992 | Nishiguchi et al. |
| 5,501,004 A | 3/1996 | Onitsuka |
| 5,859,924 A | 1/1999 | Liu et al. |
| 5,877,549 A | 3/1999 | Kim |
| 5,986,334 A | 11/1999 | Lee |
| 6,001,671 A | 12/1999 | Fjelstad |
| 6,013,948 A | 1/2000 | Akram et al. |
| 6,093,584 A | 7/2000 | Fjelstad |
| 6,135,522 A | 10/2000 | Su et al. |
| 6,190,509 B1 | 2/2001 | Haba |
| 6,190,717 B1 | 2/2001 | Benham |
| 6,191,477 B1 | 2/2001 | Hashemi |
| 6,239,482 B1 | 5/2001 | Fillion et al. |
| 6,252,301 B1 | 6/2001 | Gilleo et al. |
| 6,306,685 B1 | 10/2001 | Liu et al. |
| 6,336,990 B1 | 1/2002 | Tanaka et al. |
| 6,368,896 B2 | 4/2002 | Farnworth et al. |
| 6,392,305 B1 | 5/2002 | Huang et al. |

(Continued)

OTHER PUBLICATIONS

H. Theuss, K. Pressel, S. Paulus, T. Kilger, J. Dangelmaier, R. Lehner, B. Eisener, H. Kiendl, J. Schischka, A. Graff, M. Petzold, "A Highly Reliable Flip Chip Solution based on Electroplated AuSn Bumps in a Leadless Package", 0-7803-8906, Sep. 2005 © 2005 IEEE; pp. 272 through 279.

*Primary Examiner*—Lynne A Gurley
*Assistant Examiner*—Vernon P Webb
(74) *Attorney, Agent, or Firm*—Thomas R. FitzGerald, Esq.; Hiscock & Barclay, LLP

(57) ABSTRACT

Provided are a semiconductor package which is small in size but includes a large number of terminals disposed at intervals equal to or greater than a minimum pitch, and a method of fabricating the semiconductor package. The semiconductor package includes a semiconductor chip having a bottom surface on which a plurality of bumps are formed, redistribution layer patterns formed under the semiconductor chip and each including a first part electrically connected to at least one of the bumps and a second part electrically connected to the first part, an encapsulation layer surrounding at least a top surface of the semiconductor chip, and a patterned insulating layer formed below the redistribution layer patterns and exposing at least parts of the second parts of the redistribution layer patterns.

5 Claims, 5 Drawing Sheets

U.S. PATENT DOCUMENTS

| | | |
|---|---|---|
| 6,396,557 B1 | 5/2002 | Tajima |
| 6,407,508 B1 | 6/2002 | Kawada et al. |
| 6,426,554 B1 | 7/2002 | Egawa |
| 6,441,498 B1 | 8/2002 | Song |
| 6,468,830 B1 | 10/2002 | Carson |
| 6,476,503 B1 | 11/2002 | Imamura et al. |
| 6,518,091 B1 | 2/2003 | Haba |
| 6,518,097 B1 | 2/2003 | Ym et al. |
| 6,528,344 B2 | 3/2003 | Kang |
| 6,528,893 B2 | 3/2003 | Jung et al. |
| 6,541,848 B2 | 4/2003 | Kawahara et al. |
| 6,555,917 B1 | 4/2003 | Heo |
| 6,566,748 B1 | 5/2003 | Shimizu et al. |
| 6,582,979 B2 | 6/2003 | Coccioli et al. |
| 6,611,052 B2 | 8/2003 | Poo et al. |
| 6,611,055 B1 | 8/2003 | Hashemi |
| 6,621,286 B2 | 9/2003 | Takada et al. |
| 6,751,781 B2 | 6/2004 | Lin et al. |
| 6,756,666 B2 | 6/2004 | Hosomi |
| 6,949,142 B2 | 9/2005 | Charpin |
| 2004/0032013 A1* | 2/2004 | Cobbley et al. ............. 257/678 |
| 2004/0195701 A1* | 10/2004 | Attarwala .................... 257/783 |
| 2006/0261364 A1* | 11/2006 | Suehiro et al. .............. 257/100 |

* cited by examiner

SEMICONDUCTOR PACKAGE FORM WITHIN AN ENCAPSULATION

BACKGROUND OF THE INVENTION

1. Field of the Invention

The present invention relates to a semiconductor device, and more particularly, to a semiconductor package for protecting a semiconductor chip and connecting the semiconductor chip with an external device.

2. Description of the Related Art

As the integration density of semiconductor chips increases, the number of pads of each semiconductor chip increases. However, semiconductor packages are being continuously demanded to be smaller and lighter with an increasing demand for portable semiconductor products. For example, a chip scale package (CSP) can reduce the size of a semiconductor package by forming terminals on pads of a semiconductor chip.

However, the terminals of the CSP are required to be large enough to form a stable electrical contact with an external device and to be separated from one another by suitable pitches. For example, when the terminals of the CSP are connected to an external device by solder balls, and the pitch between terminals is less than or equal to a predetermined value, the solder balls may adhere to each other. For example, JEDEC standards prescribe a minimum pitch between the terminals.

The JEDEC Solid State Technology Association (once known as the Joint Electron Device Engineering Council), is the semiconductor engineering standardization body of the Electronic Industries Alliance (EIA), a trade association that represents all areas of the electronics industry. JEDEC was originally created in 1960 as a joint activity between EIA an NEMA, to cover the standardization of discrete semiconductor devices and later expanded in 1970 to include integrated circuits. JEDEC establishes standards for the spacing of external contacts that lead into integrated circuit and semiconductor device packages. Spacing of the external contacts are important because suppliers of die attach equipment and soldering equipment must know the spacing between the contact leads or pads of a circuit of a device into to attach the circuit or device to a printed circuit board so that the soldered contacts do not interfere with each other.

However, a decrease in the number of pads of each semiconductor chip requires an increase in the number of terminals of the CSP. Hence, it is difficult to form an increased number of terminals spaced from each other at a predetermined pitch on a small semiconductor chip. As a result, the terminals may extend up to the outside of the semiconductor chip, and thus additional wires for connecting the pads on the semiconductor chip to the terminals may be needed.

For example, U.S. Pat. No. 6,001,671, issued to Fjelstad, discloses a semiconductor package in which conductive pads are used as terminals and a semiconductor chip is connected to the terminals by wire bonding.

However, a method of manufacturing the semiconductor package, which is disclosed in U.S. Pat. No. 6,001,671, is complicated because it requires a wire bonding process. Also, in the method, the conductive pads can only be disposed around the semiconductor chip, thus enlarging the semiconductor package.

SUMMARY OF THE INVENTION

The present invention provides a semiconductor package which is small in size but includes a large number of terminals disposed at intervals equal to or greater than a minimum pitch.

The present invention also provides a method of fabricating the semiconductor package.

According to an aspect of the present invention, there is provided a semiconductor package including: a semiconductor chip comprising a top surface and a bottom surface, the bottom surface having a plurality of bumps formed thereon; redistribution layer patterns formed under the semiconductor chip, comprising a first part electrically connected to at least one of the bumps and a second part electrically connected to the first part; a patterned insulating layer formed below the redistribution layer patterns, exposing at least a part of the second part of the redistribution layer patterns; and an encapsulation layer exposing a bottom surface of the patterned insulating layer and surrounding the semiconductor chip, the bumps, and the redistribution layer patterns.

The semiconductor package may further include an organic insulating layer interposed between the redistribution layer patterns and the semiconductor chip, having conductive particles distributed in the organic insulating layer. The first parts of the redistribution layer patterns may be electrically connected to the bumps by the conductive particles of the organic insulating layer.

The bumps may directly contact the first parts of the redistribution layer patterns.

According to another aspect of the present invention, there is provided a method of fabricating a semiconductor package, including the operations of: forming a semiconductor chip comprising a top surface and a bottom surface, the bottom surface having a plurality of bumps formed thereon; forming a sacrificial substrate on which redistribution layer patterns comprising first parts facing the bumps and second parts electrically connected to the first parts are formed; disposing the semiconductor chip over the sacrificial substrate on which the redistribution layer patterns are formed, and electrically connecting the bumps to the first parts of the redistribution layer patterns; forming an encapsulation layer on the sacrificial substrate to surround the semiconductor chip on which the redistribution layer patterns are formed; removing the sacrificial substrate so that the redistribution layer patterns are exposed; and forming a patterned insulating layer below the exposed redistribution layer patterns, the patterned insulating layer exposing at least parts of the second parts of the redistribution layer patterns.

In the operation of electrically connecting the bumps to the first parts of the redistribution layer patterns, an organic insulating layer having conductive particles distributed therein may be used.

In the operation of electrically connecting the bumps to the first parts of the redistribution layer patterns, the bumps may be physically bonded to the first parts of the redistribution layer patterns.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
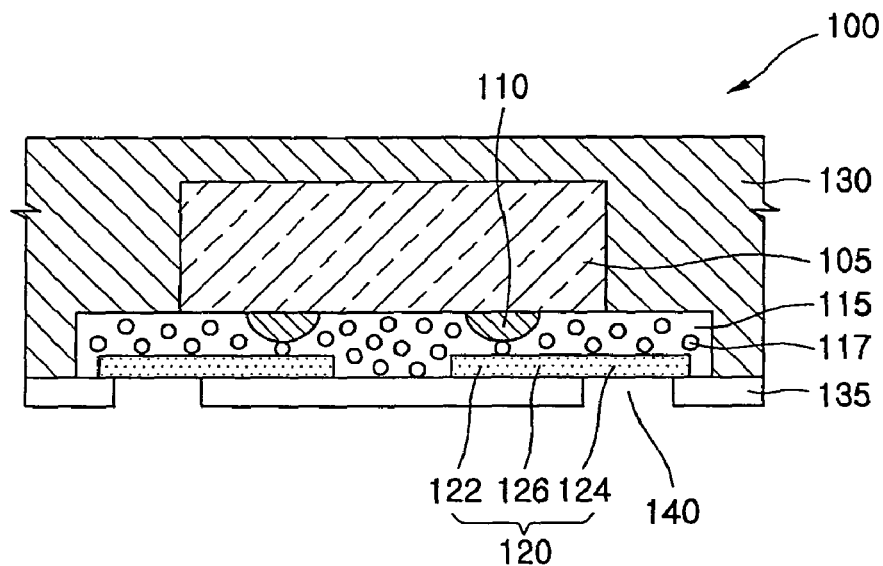
FIG. 1 is a cross-section of a semiconductor package according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity.

Figure 2:
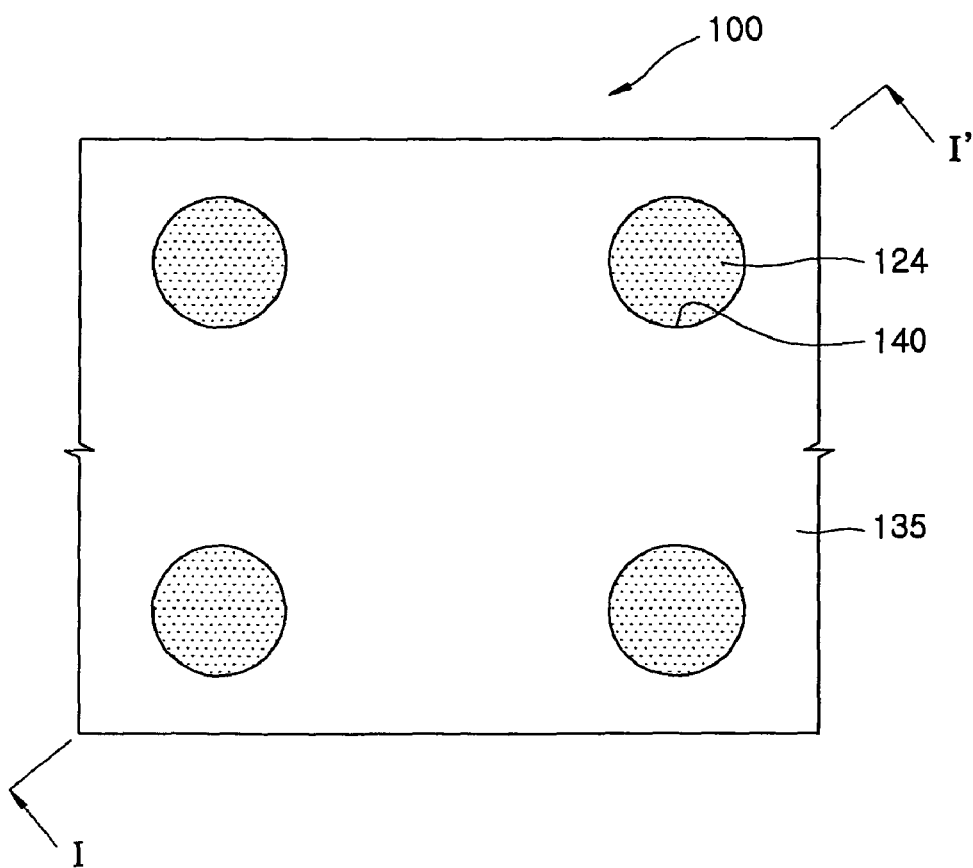
FIG. 2 is a bottom view of the semiconductor package of FIG. 1.

FIG. 1 is a cross-section of a semiconductor package 100 according to an embodiment of the present invention. FIG. 2 is a bottom view of the semiconductor package 100. FIG. 1 may be a cross-section taken along line I-I' of FIG. 2.

Referring to FIG. 1, a plurality of bumps 110 are formed on a bottom surface of a semiconductor chip 105. For example, the bumps 110 may be formed on metal pads (not shown) of the semiconductor chip 105. The metal pads are electrically connected to unit elements (not shown) formed therebelow. The bumps and metal pads provide input and output terminals for connecting the chip 105 to other chips. The internal structure of the semiconductor chip 105 may vary, and accordingly does not limit the scope of the present invention. For example, the semiconductor chip 105 may include a memory device or various types of logic circuits.

The number of bumps 110 may depend on the number of metal pads, which may vary according to the integration density of the semiconductor chip 105. For example, as the integration density of the semiconductor chip 105 increases, the number of metal pads increase, and accordingly, the number of bumps 110 may increase. The bumps 110 may include a conductive material, such as, copper or gold. The bumps 110 may have any shape as long as it protrudes from the bottom surface of the semiconductor chip 105.

The bumps 110 are electrically connected to redistribution layer patterns 120. The redistribution layer patterns 120 are conductive members that may serve as terminals which are connected to an external device. Each of the redistribution layer patterns 120 includes a bump contact pattern 122 and a land pattern 124, which are electrically connected to each other. For example, the land pattern 124 may serve as a terminal which is connected to an external device, and the bump contact pattern 122 may connect the bump 110 to the land pattern 124. The bump contact pattern 122 and the land pattern 124 are connected by a conductive line 126.

Figure 3:
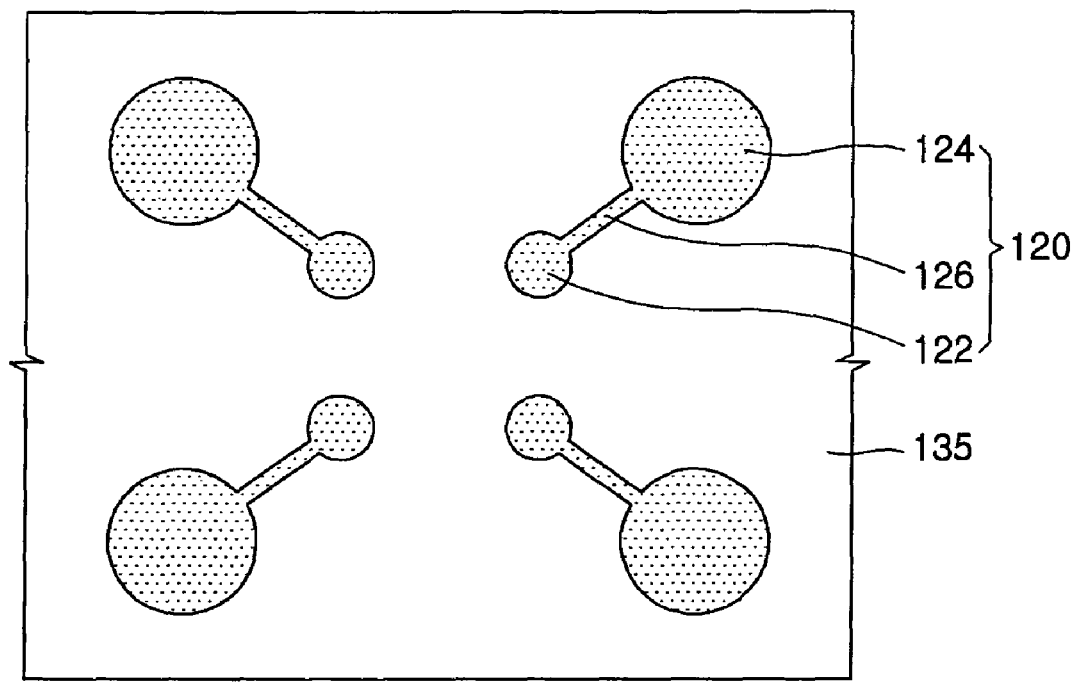
FIG. 3 is a plan view of a sacrificial substrate on which redistribution layer patterns are formed.

The redistribution layer patterns 120, which are formed on a sacrificial substrate 128 of FIG. 4, will now be described in greater detail with reference to FIG. 3. The redistribution layer patterns 120 redistribute randomly distributed bumps 110 so that the bumps 110 can be connected to the external device. The redistribution layer patterns 120 may also be used to extend the pitch between adjacent bumps 110. In this case, the land patterns 124 may have a larger pitch than the bump contact patterns 122. For example, although the bump contact patterns 122 do not have a JEDEC standard pitch, the land patterns 124 may have the JEDEC standard pitch.

The shape of the redistribution layer patterns 120 shown in FIG. 1 is just an example, but the bump contact patterns 122 and the land patterns 124 may have various shapes and be disposed in various configurations. For example, in contrast with FIG. 1, the land patterns 124 may be distributed inside and outside the bump contact patterns 122.

Furthermore, a surface area of each of the land patterns 124 is larger than that of each of the bump contact patterns 122. Hence, by using the land patterns 124 as terminals, a sufficient area of contact with the external device can be secured. Each of the redistribution layer patterns 120 may be a gold layer, a nickel layer, a copper layer, or a complex layer which is a stack of at least one of these layers. For example, the redistribution layer pattern 120 may be a complex layer formed by stacking a gold layer, a nickel layer, a copper layer, a nickel layer, and a gold layer.

Referring back to FIG. 1, the bumps 110 and the bump contact patterns 122 are electrically connected to each other by an organic insulating layer 115 in which conductive particles 17 are distributed. For example, the electrical connection of the bumps 110 with the bump contact patterns 122 may be achieved in such a way that a bump 110 and a bump contact pattern 122 are commonly connected to at least one of the conductive particles 117. The organic insulating layer 115 may include an anisotropic conductive film (ACF), an anisotropic conductive paste (ACP), and an anisotropic conductive adhesive (ACA). The conductive particles 117 may include metal particles, for example, gold particles, copper particles, or nickel particles, or particles obtained by plating polymer beads with gold.

Referring to FIGS. 1 and 2, a patterned insulating layer 135 is formed below the redistribution layer patterns 120, more specifically, below the organic insulating layer 115 that exposes the redistribution layer patterns 120. The insulating layer 135 has holes 140 through which at least parts of the land patterns 124 are exposed. For example, the insulating layer 135 may include a solder resist layer or a polyimide layer.

The exposed parts of the land patterns 124 may electrically contact the external device. For example, the exposed parts of the land patterns 124 may be electrically connected to the external device via solder balls. Although the holes 140 are formed outside the semiconductor chip 105 in FIG. 1, they may be distributed inside and outside the semiconductor chip 105 according to the configuration of the land patterns 124.

A pitch between exposed land patterns 124 may be greater than that between bumps 110 or metal pads. Hence, the bump contact patterns 122, facing the bumps 110, may extend using the land patterns 124 having a larger pitch. Thus, the semiconductor package 100 can be reliably connected to an external device having connection pads (not shown) having a larger pitch than the bumps 110 by using the land patterns 124. In addition, the semiconductor package 100 can be reduced in size by depositing the bumps 100 and the redistribution layer patterns 120 under the semiconductor chip 105. In other words, the semiconductor package 100 may have a CSP structure.

An encapsulation layer 130 covers the semiconductor chip 105 below which the redistribution layer patterns 120 and the patterned insulation layer 135 are formed. The encapsulation layer 130 protects the semiconductor chip 105 from external environments.

FIGS. 4 through 8 are cross-sectional views illustrating a method of manufacturing the semiconductor package 100 of FIG. 1. The structure of the semiconductor package 100 may be described with reference to FIGS. 1 through 3 and corresponding previous descriptions.

Figure 4:
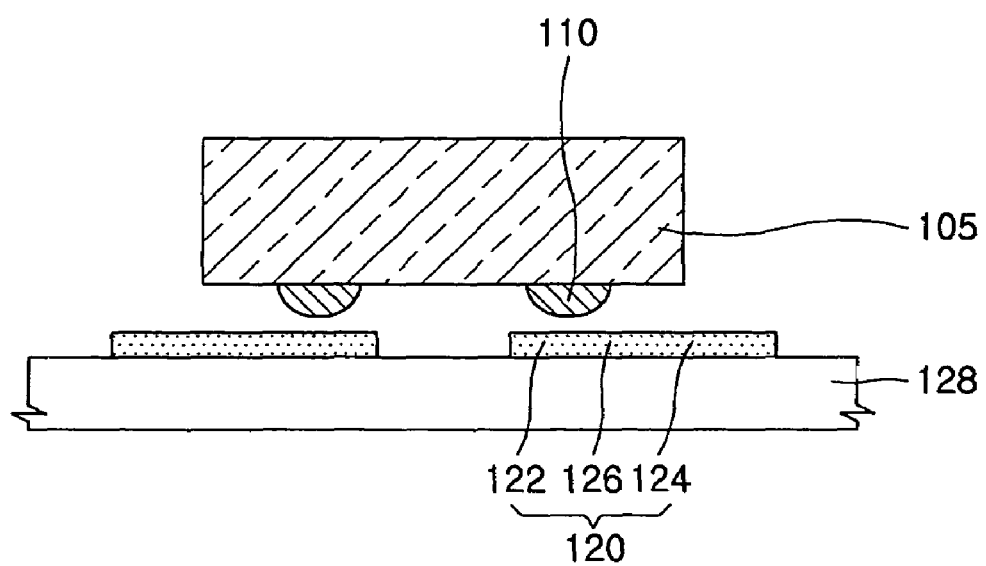
FIGS. 4 through 8 are cross-sectional views illustrating a method of manufacturing the semiconductor package of FIG. 1.

Referring to FIG. 4, the semiconductor chip 105 having the plurality of bumps 110 formed thereon is prepared for. The bumps 110 may be formed on the semiconductor chip 105 in a method similar to wire bonding. The bumps 110 help the metal pads of the semiconductor chip 105 to protrude to the outside. Additionally, the bumps 110 may have good adhesion with the metal pads. Accordingly, the bumps 100 should be at least 5 µm large and may be less than several hundreds of µm so as to achieve stable flip chip bonding. For example, the diameter of each of the bumps 110 may range from 10 µm to 200 µm.

Aside from the formation of the bumps 110 on the semiconductor chip 105, the sacrificial substrate 128 having the redistribution layer patterns 120 formed thereon is provided. The redistribution layer patterns 120 and the sacrificial substrate 128 may be understood from the descriptions of FIGS. 1 and 3. The sacrificial substrate 128 having the redistribution layer patterns 120 formed thereon may be commercially manufactured by plating or other processes.

The sacrificial substrate 128 may be formed of a material having etch selectivity with respect to the redistribution layer patterns 120. The sacrificial substrate 128 may be a metal layer, such as, a copper layer or an aluminum layer. As described above, the redistribution layer patterns 120 may be covered with a gold layer.

Figure 5:
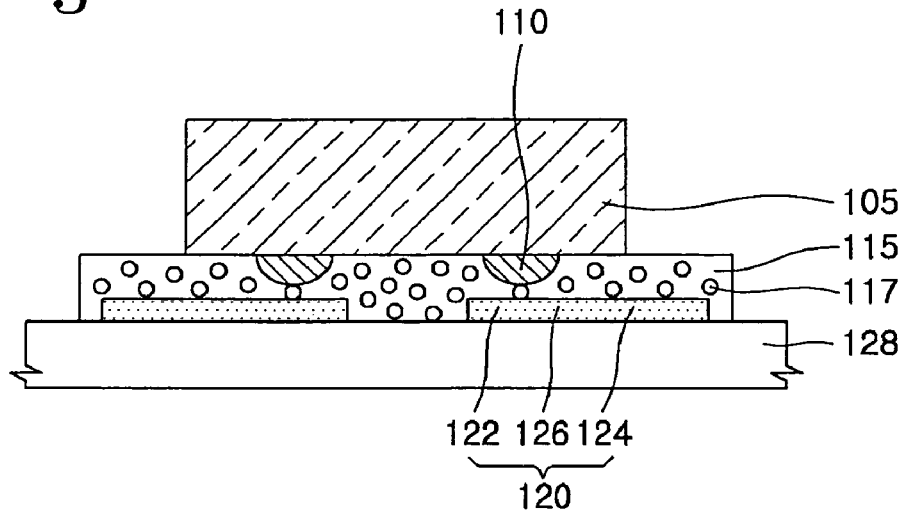

Referring to FIG. 5, the bumps 110 are electrically connected to the redistribution layer patterns 120 by the organic insulating layer 115 in which the conductive particles 117 are distributed. More specifically, the bumps 110 are electrically connected to the bump contact patterns 122 by one or more of the conductive particles 117.

For example, the organic insulating layer 115 may be inserted between the bottom surface of the semiconductor chip 105 and the sacrificial substrate 128, more specifically; between the bumps 110 and the redistribution layer patterns 120. The organic insulating layer 115 may be formed before or after flip chip bonding. Thereafter, thermo-compression is applied to the semiconductor chip 105 or the redistribution layer patterns 120, so that each of the bumps 110 and each of the redistribution layer patterns 120 can commonly contact at least one of the conductive particles 117. Hence, reliable electrical connection between the redistribution layer patterns 120 and the bumps 110 can be achieved.

Figure 6:
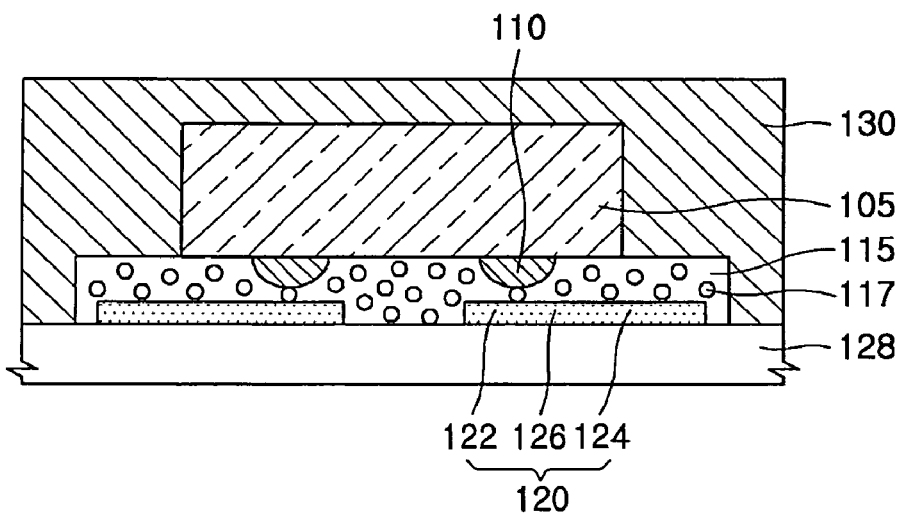

Referring to FIG. 6, the encapsulation layer 130 is formed on the sacrificial substrate 128 to surround the semiconductor chip 105 having the redistribution layer patterns 120 formed thereon. The encapsulation layer 130 may be epoxy or encapsulating molding compound (EMC). The encapsulation layer 130 protects the semiconductor chip 105 from a chemical reaction, such as, external physical impact and moisture.

Figure 7:
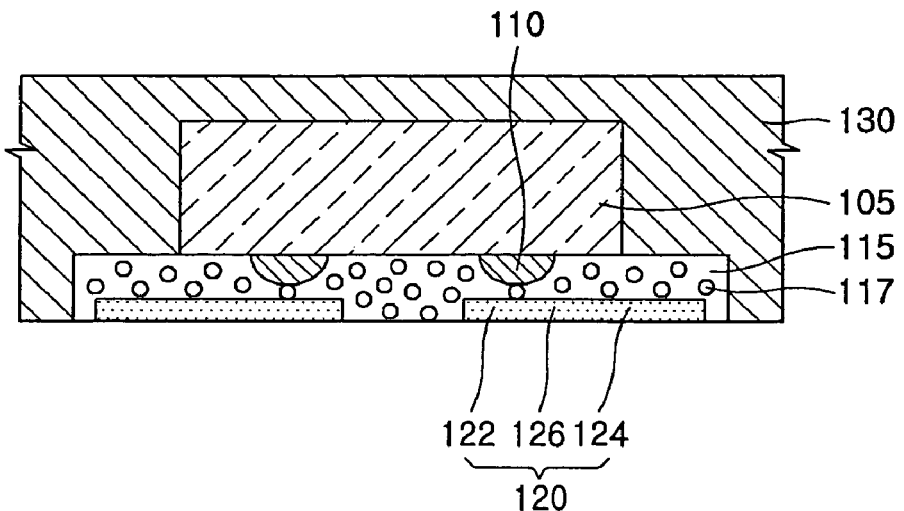

Referring to FIGS. 6 and 7, the sacrificial substrate 128 is removed so that the redistribution layer patterns 120 can be exposed. For example, only the sacrificial substrate 128 may be etched without etching the redistribution layer patterns 120. The gold layer coated on the redistribution layer patterns 120 protects the redistribution layer patterns 120 from etching.

Figure 8:
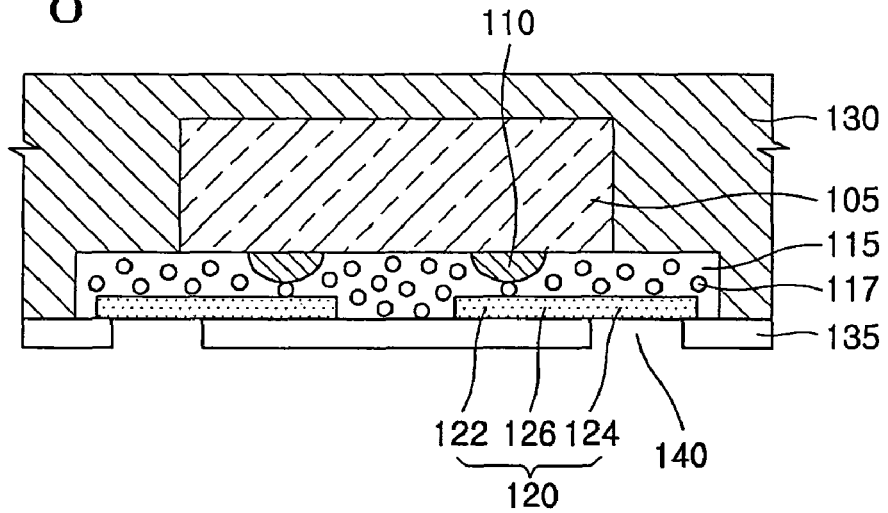

Referring to FIG. 8, the patterned insulating layer 135 is formed below the redistribution layer patterns 120 which are exposed. More specifically, the patterned insulative layer 135 having the holes 140 through which parts of the land patterns 124 are exposed is formed below the organic insulating layer 115 which exposes the redistribution layer patterns 120. For example, an insulating layer (not shown) may be formed below the organic insulating layer 115, and the holes 140 may be formed by patterning the insulating layer using photolithography and an etching technique.

Figure 9:
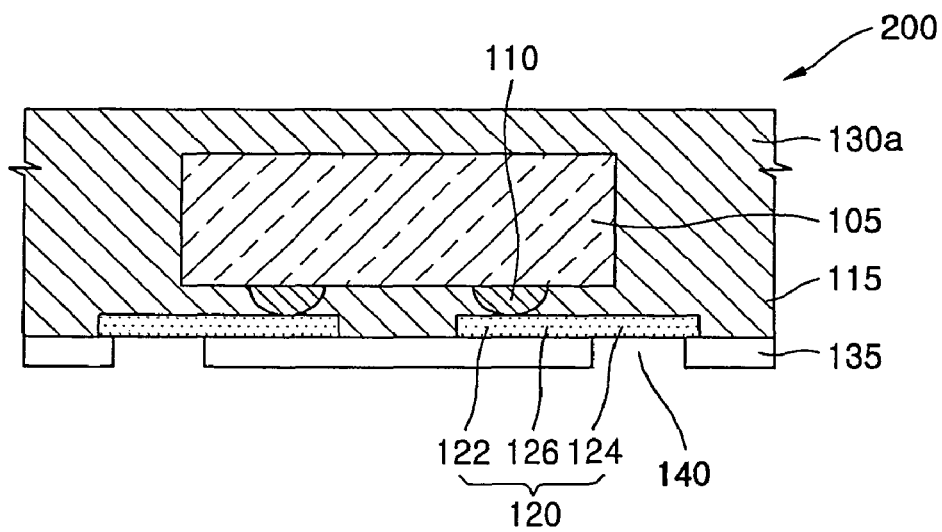
FIG. 9 is a cross-section of a semiconductor package according to another embodiment of the present invention.

FIG. 9 is a cross-section of a semiconductor package 200 according to another embodiment of the present invention. The semiconductor package 200 is a modification of the semiconductor package 100. Hence, descriptions of identical or similar parts of the semiconductor packages 100 and 200 will be omitted, and only differences will now be described. Like reference numerals in the two semiconductor packages 100 and 200 denote like elements.

Referring to FIG. 9, the bumps 110 directly contact the redistribution layer patterns 120. More specifically, the bumps 110 and the bump contact patterns 122 are physically bonded together to be electrically connected to each other.

An encapsulation layer 130a covers the top surface and lateral surfaces of the semiconductor chip 105. The encapsulation layer, 130a may be further interposed between the bottom surface of the semiconductor chip 105 and the redistribution layer patterns 120 and between the bottom surface of the semiconductor chip 105 and the patterned insulating layer 135. In this case, the encapsulation layer 130a may be a single layer or a complex layer. For example, the encapsulation layer 130a may be a single layer, such as, an EMC layer or an epoxy layer.

Alternatively, the top surface and lateral surfaces of the semiconductor chip 105 may be covered with an EMC layer or an epoxy layer, and a solder resist layer or a polyimide layer may be interposed between the bottom surface of the semiconductor chip 105 and the redistribution layer patterns 120 and between the bottom surface of the semiconductor chip 105 and the patterned insulating layer 135.

The semiconductor package 200 may have the advantages of the semiconductor package 100. For example, the pitch between land patterns 124 may be greater than that between bumps 110 or metal pads. Thus, by using the semiconductor package 200, terminals, namely, the land patterns 124, may have an appropriate pitch. In addition, the semiconductor package 200 can be reduced in size by depositing the bumps 110 and the redistribution layer patterns 120 under the semiconductor chip 105. In other words, the semiconductor package 200 may have a CSP structure.

FIGS. 10 through 13 are cross-sectional views illustrating a method of manufacturing the semiconductor package 200 of FIG. 9. The method of FIGS. 10 through 13 is described with reference to the method of FIGS. 4 through 8. Like reference numerals in the two methods denote like elements.

Referring to FIG. 4, the semiconductor chip 105 having the plurality of bumps 110 formed on the bottom surface thereof is provided. After or before the preparation of the semiconductor chip 105, the sacrificial substrate 128 having the redistribution layer patterns 120 formed thereon is provided. A detailed description of the sacrificial substrate 128 can be made with reference to the method of FIGS. 4 through 8, so it is omitted.

Figure 10:
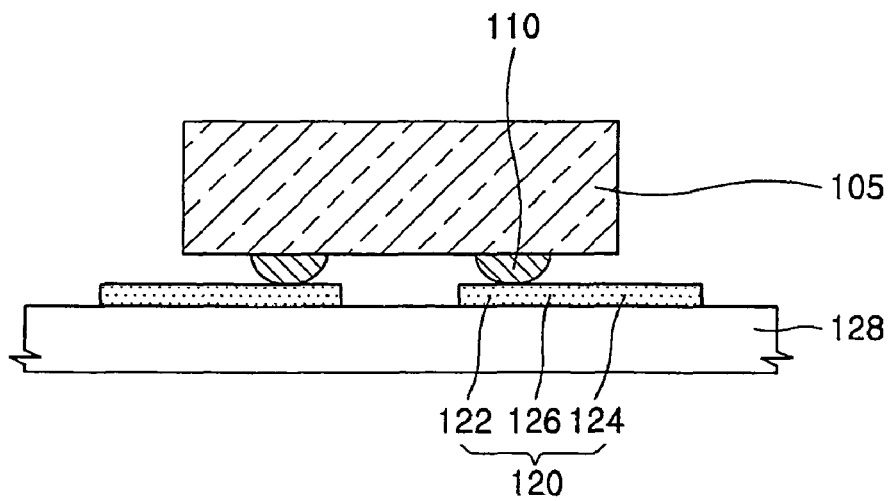
FIGS. 10 through 13 are cross-sectional views illustrating a method of manufacturing the semiconductor package of FIG. 9.

Referring to FIG. 10, the bumps 110 directly contacts the bump contact patterns 122. For example, the bumps 110 may be physically bonded to the bump contact patterns 122. More specifically, the semiconductor chip 105 and the redistribution layer patterns 120 come close to each other so that the bumps 110 can contact the bump contact patterns 122. Thereafter, thermosonic waves are applied to the semiconductor chip 105 and the redistribution layer patterns 120 which are close to each other. Hence, the redistribution layer patterns 120 and the bumps 110 which contact with each other can be bonded to each other and electrically connected to each other.

Figure 11:
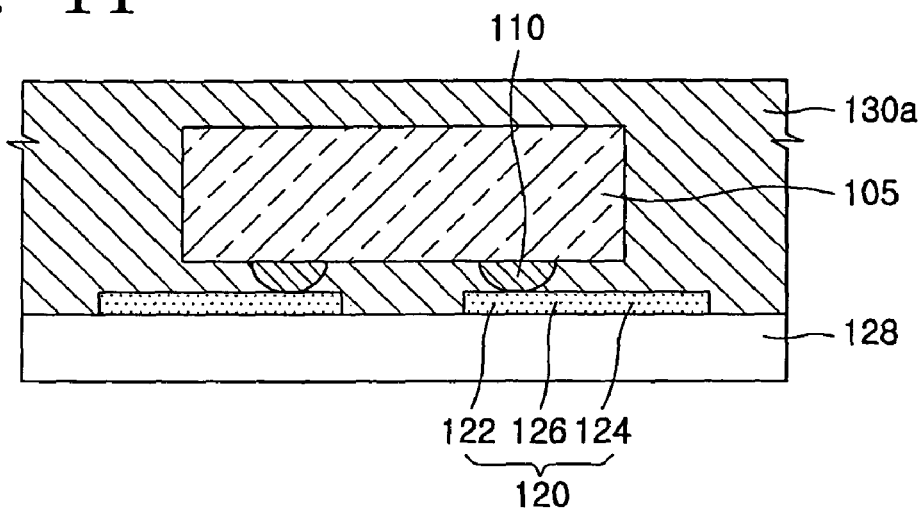

Referring to FIG. 11, the encapsulation layer 130*a* is formed on the sacrificial substrate 128 to surround the semiconductor chip 105 and the redistribution layer patterns 120. The encapsulation layer 130*a* may be a single layer or a complex layer as described above with reference to FIG. 9.

Figure 12:
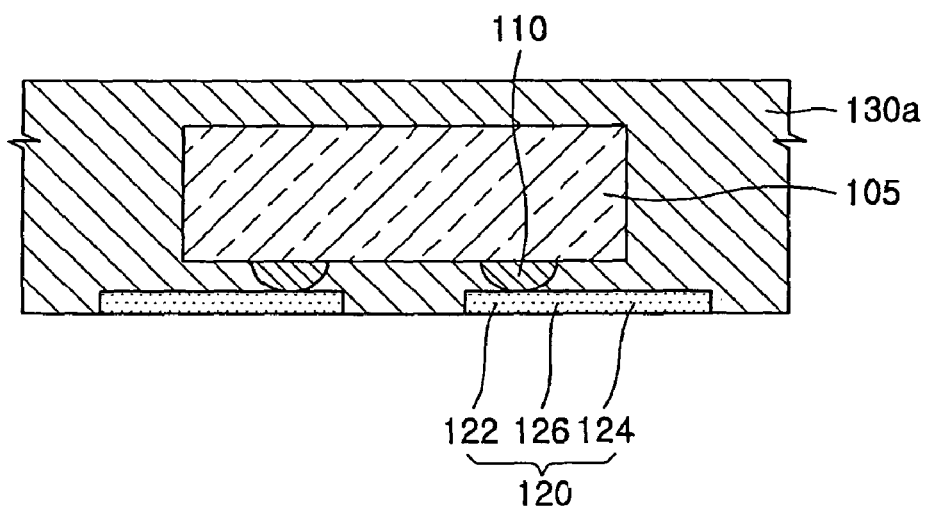

Referring to FIG. 12, the sacrificial substrate 128 is removed so that the redistribution layer patterns 120 can be exposed. The removing method is the same as described above in the previous method.

Figure 13:
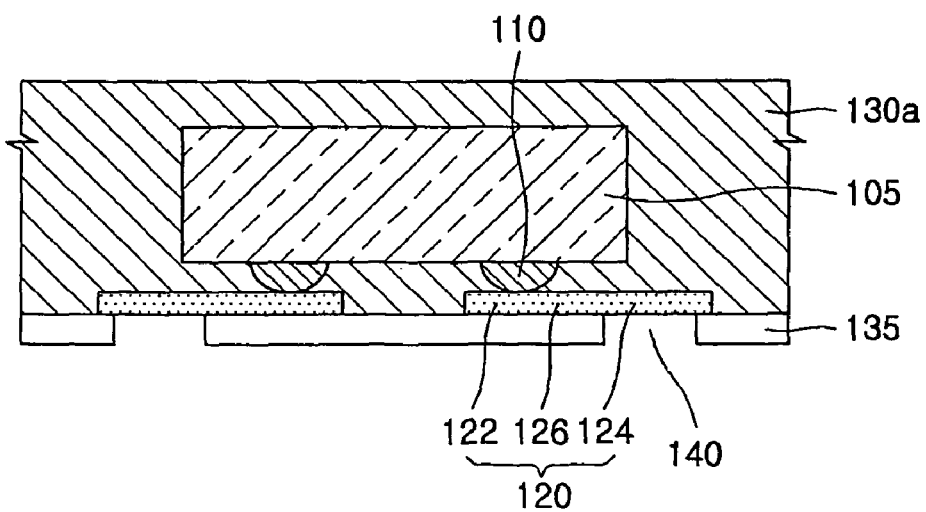

Referring to FIG. 13, the patterned insulating layer 135 is formed below the redistribution layer patterns 120 which are exposed. More specifically, the patterned insulatiive layer 135 having the holes 140 through which parts of the land patterns 124 are exposed is formed below the encapsulation layer 130*a* which exposes the redistribution layer patterns 120. As described above, the patterned insulating layer 135 may be formed using photolithography and an etching technique.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor package comprising:
   a semiconductor chip comprising a top surface and a bottom surface, the bottom surface having a plurality of bumps formed thereon;
   redistribution layer patterns formed under the semiconductor chip, comprising a first part electrically connected to at least one of the bumps and a second part electrically connected to the first part;
   a patterned insulating layer formed below the redistribution layer patterns, exposing at least a part of the second part of the redistribution layer patterns;
   an encapsulation layer exposing a bottom surface of the patterned insulating layer and surrounding the semiconductor chip, the bumps, and the redistribution layer patterns; and
   an organic insulating layer interposed between the redistribution layer patterns and the semiconductor chip, having electrically conductive particles distributed in the organic insulating layer,
   wherein the electrically conductive particles are interposed between top surfaces of the first parts of the redistribution layer patterns and bottom surfaces of the bumps to directly contact the top surfaces of first parts of the redistribution layer patterns and the bottom surfaces of the bumps.

2. The semiconductor package of claim 1, wherein a surface area of the second part of each of the redistribution layer patterns is greater than a surface area of the first part of each of the redistribution layer patterns.

3. The semiconductor package of claim 1, wherein a diameter of each of the bumps is in the range of 5 to 200 μm.

4. The semiconductor package of claim 1, wherein each of the redistribution layer patterns comprises one or more layers of the group consisting of a gold layer, a nickel layer, and a copper layer.

5. The semiconductor package of claim 1, wherein the second parts of the redistribution layer patterns are land patterns to be connected to an external device.

* * * * *

UNITED STATES PATENT AND TRADEMARK OFFICE
CERTIFICATE OF CORRECTION

PATENT NO.          : 7,728,437 B2                               Page 1 of 1
APPLICATION NO.     : 11/286786
DATED               : June 1, 2010
INVENTOR(S)         : Seung-yong Choi et al.

It is certified that error appears in the above-identified patent and that said Letters Patent is hereby corrected as shown below:

The first inventor's name is misspelled on the issued patent. "Seung-yong" is misspelled as "Soung-yong".

Signed and Sealed this

Thirteenth Day of July, 2010

David J. Kappos
*Director of the United States Patent and Trademark Office*

UNITED STATES PATENT AND TRADEMARK OFFICE
CERTIFICATE OF CORRECTION

PATENT NO. : 7,728,437 B2  Page 1 of 1
APPLICATION NO. : 11/286786
DATED : June 1, 2010
INVENTOR(S) : Seung-yong Choi et al.

It is certified that error appears in the above-identified patent and that said Letters Patent is hereby corrected as shown below:

Title Page, Item (75) Inventors,
The first inventor's name is misspelled on the issued patent.
"Soung-yong" should read -- Seung-yong --.

This certificate supersedes the Certificate of Correction issued July 13, 2010.

Signed and Sealed this

Seventeenth Day of August, 2010

David J. Kappos
*Director of the United States Patent and Trademark Office*